United States Patent [19]

Gowan et al.

[11] 4,433,045
[45] Feb. 21, 1984

[54] LASER MIRROR AND METHOD OF FABRICATION

[75] Inventors: John G. Gowan, London, England; Keith R. Shillito, Albuquerque, N. Mex.

[73] Assignee: The United States of America as represented by the Secretary of the Air Force, Washington, D.C.

[21] Appl. No.: 342,996

[22] Filed: Jan. 27, 1982

[51] Int. Cl.³ .............. G03C 5/00; G02B 5/08
[52] U.S. Cl. ................... 430/321; 430/323; 430/324; 430/329; 430/330; 350/310; 350/320
[58] Field of Search .............. 430/321, 324, 323, 329, 430/330, 331, 945, 314, 320; 350/310, 320, 288

[56] References Cited

U.S. PATENT DOCUMENTS

| | | | |
|---|---|---|---|
| 3,510,371 | 5/1970 | Frankson | 156/11 |
| 3,781,094 | 12/1973 | Griest | 350/310 |
| 3,817,606 | 6/1974 | Locke et al. | 350/310 |
| 3,884,558 | 5/1975 | Dunn et al. | 350/288 |
| 4,142,006 | 2/1979 | Choyke et al. | 427/162 |
| 4,260,658 | 4/1981 | Erickson | 428/163 |

FOREIGN PATENT DOCUMENTS 54-68258  6/1979  Japan .................. 350/320

*Primary Examiner*—John E. Kittle
*Assistant Examiner*—José G. Dees
*Attorney, Agent, or Firm*—Donald J. Singer; Bobby D. Scearce

[57] ABSTRACT

An improved laser mirror and heat exchanger and method of fabrication is described which comprises, in a preferred embodiment thereof, a carbon/carbon fiber matrix substrate having deposited thereon a transitional composition layer of carbon and tungsten carbide, and one or more layers of tungsten or tungsten carbide. These layers define a desired network of coolant passageways formed by depositing a low melting point material, such as antimony, in a raised pattern and thereover depositing the tungsten-containing layer, and subsequently melting out the low melting point material. The tungsten-containing layer may then be polished on the exposed surface to a laser mirror finish.

4 Claims, 8 Drawing Figures

LASER MIRROR AND METHOD OF FABRICATION

RIGHTS OF THE GOVERNMENT

The invention described herein may be manufactured and used by or for the Government of the United States for all governmental purposes without the payment of any royalty.

BACKGROUND OF THE INVENTION

This invention relates generally to the field of laser devices, and more specifically to improvements in heat exchangers for cooling and supporting high energy laser mirror surfaces.

The requirements of acceptable performance placed on a high energy laser mirror in the high power density environment to which it is subjected during laser operation dictates that the mirror be configured, and be constructed of materials, to be thermally stable. Heat deposited into the mirror structure by the laser must be conducted away from the mirror surfaces to avoid damage to the temperature sensitive coatings which often conventionally comprise the optical surface to enhance reflectivity. The heat exchanger and other substructure supporting the high energy laser surface must exhibit the desired heat transfer characteristics and at the same time maintain structural integrity and resistance to thermal effects for the laser mirror to function properly over an acceptably long operational lifetime.

The present invention provides a novel laser mirror and heat exchanger/substructure configuration together with the process for fabricating same. In a representative embodiment described herein, a carbon/carbon fiber matrix material is selected for the supporting substrate structure since this material may be contoured to a variety of complex shapes, exhibits the desirable thermal properties to withstand the high power density environment characteristically associated with high power laser operation, and exhibits thermal and other physical properties rendering it highly desirable as a compatible substrate material to support a heat exchanger structure of tungsten/tungsten carbide. The tungsten/tungsten carbide heat exchanger may be deposited onto the substrate by vapor deposition in the desired configuration, and a laser mirror surface may be polished into the surface of the heat exchanger. The novel structure of the present invention is lightweight and reparable, is highly creep resistant, has no machined slots or surfaces where concentrated stresses during thermal loading may arise, and may be joined in segments to provide laser mirrors of large (up to several meters) diameter. The heat exchanger also exhibits superior corrosion resistance.

It is therefore an object of the present invention to provide an improved high energy laser mirror and heat exchanger.

It is a further object of the present invention to provide an improved high energy laser mirror and heat exchanger that is lightweight, reparable and non-deforming under the thermal and mechanical loads resulting from system operation.

It is yet another object of the present invention to provide a process for fabricating an improved laser mirror and heat exchanger.

These and other objects of the present invention will become apparent as the detailed description of certain embodiments thereof proceeds.

SUMMARY OF THE INVENTION

In accordance with the foregoing principles and objects of the present invention, an improved laser mirror and heat exchanger and method of fabrication is described which comprises, in a preferred embodiment thereof, a carbon/carbon fiber matrix substrate having deposited thereon a transitional composition layer of carbon and tungsten carbide, and one or more layers of tungsten or tungsten carbide. These layers define a desired network of coolant passageways formed by depositing a low melting point material, such as antimony, in a raised pattern and thereover depositing the tungsten containing layer, and subsequently melting out the low melting point material. The tungsten containing layer may then be polished on the exposed surface to a laser mirror finish.

DESCRIPTION OF THE DRAWINGS

The present invention will be more clearly understood from the following detailed description of representative embodiments thereof read in conjunction with the accompanying drawings wherein.

DETAILED DESCRIPTION

The novel fabrication process for the laser mirror or the present invention is illustrated schematically in sequence of steps in FIGS. 1-8. The sequence illustrated in FIGS. 1-8 is contemplated both as descriptive of the process involved in the preparation of one embodiment, and as representative of a preferred structure of the novel laser mirror, of the present invention.

Figure 1:
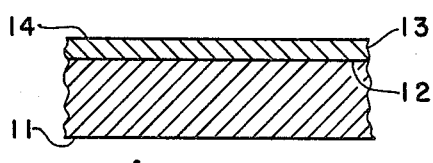
FIG. 1 is a cross sectional view of a carbon/carbon substrate with an applied layer of transitional composition carbon and tungsten carbide.

Referring first to FIG. 1, the noval mirror structure herein comprises a substrate 11 of suitable material upon which a heat exchanger for the laser mirror is grown as herein described. A preferred substrate 11 material for use herein is a carbon/carbon material comprising a weave of carbon fibers in a carbon matrix which is graphitized and densified. This material is readily available commercially, is lightweight and exhibits thermal and mechanical properties acceptable for inclusion in the structure of the laser mirror of the present invention. Substrate 11 may be of any desirable configuration for supporting the heat exchanger and mirror of the described structure in suitably stable fashion.

Surface 12 of substrate 11 may then be filled with a suitable material such as ion vapor deposited graphite to produce a pore free surface for accepting the remaining described laser mirror substructure. Upon the filled surface 12 of substrate 11 may then be deposited a layer 13 of a graduated composition of tungsten carbide and carbon or tungsten and carbon. It is highly desirable in the embodiment described herein to provide a layer 13 which gradually varies in composition through the layer thickness from predominantly carbon in contact with surface 12 of substrate 11 to predominantly tungsten at surface 14 of layer 13. Layer 13 of tungsten/carbon (W/C) may be applied by any convenient method, such as by sputtering. Varying the composition of layer 13 as described produces a structure as shown in FIG. 1 with the tungsten/carbon layer 13 thermally matched to substrate 11. Low shear stress, upon heating, results between layer 13 and substrate 11, and, simultaneously, the high tungsten or tungsten carbide content of surface 14 results in a surface desirable for further deposition of tungsten or tungsten carbide. Surface 14 of layer 13 may, if desired, be finished using conventional techniques.

Figure 2:
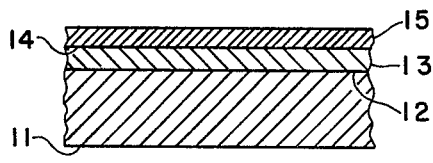
FIG. 2 illustrates the intermediate structure of FIG. 1 with the low melting metal (antimony) layer thereon.

To the structure of FIG. 1 is then applied a layer 15 of suitable (higher than about 500° C.) low melting point metal, such as electrochemically plated antimony, onto surface 14 of W/C layer 13, to produce the structure illustrated schematically in FIG. 2. Layer 15 may be composed of other suitable low melting point materials as would be within the scope of this invention, although antimony (m.p. 630° C.) may be preferred.

Figure 4:
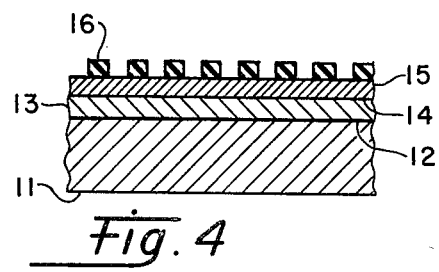
FIG. 4 illustrates the intermediate structure of FIG. 3 following removal of unexposed (unpolymerized) photoresist material.
Figure 8:
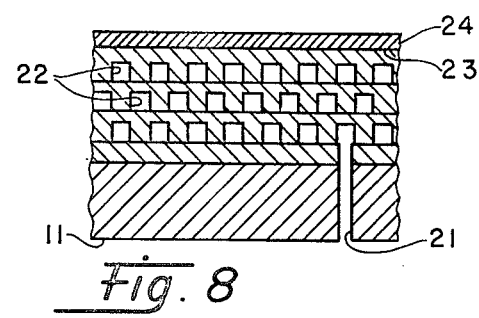
FIG. 8 is a cross section of a representative embodiment of the invention comprising a mirror surface and applied enhancement coatings on the intermediate structure of FIG. 7 following removal of the low melting material from the heat exchanger passageways.
Figure 3:
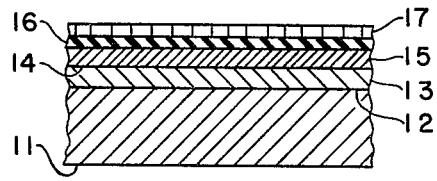
FIG. 3 illustrates the structure of FIG. 2 with the layer of photoresist material and mask applied to the low melting layer.

One section of the tungsten/tungsten carbide heat exchanger structure of the novel mirror herein may then be produced by applying to the layer 15 a coating 16 of photoresist material including any one of many well known brands commercially available. As illustrated in FIG. 3, onto coating 16 is overlaid a photographic mask 17 having the desired heat exchanger passageway pattern produced by conventional microcircuit techniques. Coating 16 with mask 17 overlaid is then exposed to ultraviolet radiation to selectively harden that portion of (unmasked) coating 16 which defines the ultimate desired pattern of the heat exchanger passageways. The unhardened (unpolymerized masked) portion of the photoresist material of coating 16 may be removed chemically to produce the intermediate structure of FIG. 4, and the corresponding underlying portion of antimony layer 15 may then be selectively removed by conventional chemical process to produce the intermediate structure illustrated in FIG. 5, comprising substrate 11, layer 13 of transitional composition W/C, and a desired network of distinct raised portions or strips 18 of undissolved antimony defining the shape and pattern of the desired heat exchanger passageways. That portion of the surface 14 of W/C layer 13 between strips 18 as illustrated in FIG. 5 is now free of any deposited layer 15 and coating 16 materials preparatory to deposition of further tungsten or tungsten carbide as hereinafter described.

Figure 5:
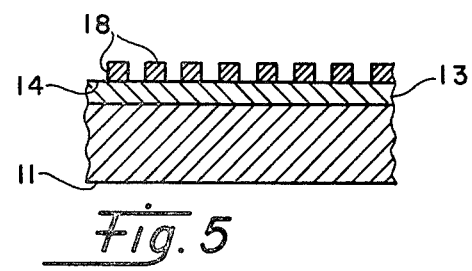
FIG. 5 illustrates the intermediate structure of low melting material in the desired cooling channel network applied to the structure of FIG. 1 following procedures associated with FIGS. 2-4.

Upon the intermediate structure illustrated in FIG. 5 may now be deposited tungsten or tungsten carbide to provide a layer 19 covering antimony strips 18 and having a substantially uniform surface 20, which may, if desired, be finished in manner similar to surface 14 of layer 13 of FIG. 1. Layer 19 is preferably finished to a total thickness which depends on the heat removal requirements of the exchanger and the power of the laser, but approximately 0.50 mm to about 0.75 mm, thereby covering strips 18 to a thickness of from about 0.25 mm to about 0.30 mm.

Figure 7:
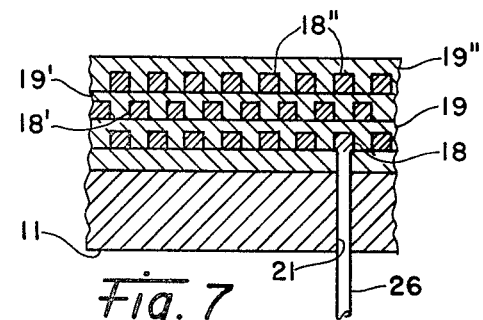
FIG. 7 is a cross section of a structure of this invention including multiple heat exchanger layers.
Figure 6:
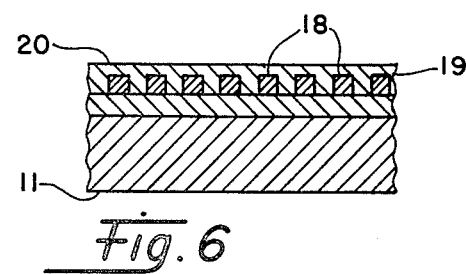
FIG. 6 is a cross section of the intermediate structure of FIG. 5 with a first heat exchanger layer applied thereon.

The intermediate structure illustrated in FIG. 6 therefore has one section of heat exchanger built up, as represented by tungsten layer 19. If desired, the procedures associated with the successive application onto surface 14 of antimony layer 15, photoresist 16, and mask 17 and subsequent irradiation of the unmasked photoresist, removal of antimony and resist and application of additional tungsten or tungsten carbide according to the procedures described in the immediately foregoing three paragraphs and related to FIGS. 2-6 may be repeated as often as desired to produce a stacked configuration of heat exchanger sections comprising CVD deposited tungsten or tungsten carbide layers 19, 19', 19" each respectively covering antimony strips 18, 18', 18" such as illustrated in FIG. 7. Allowances must be made for connecting the heat exchanger levels and manifolding the flow; however, this does not present an unusual or difficult problem and is left to the designer since each configuration will be different.

Once the desired number of heat exchanger sections has been built up as just described, the antimony strips 18, 18', 18" may be removed by suitable means. In the embodiment herein described, the antimony of strips 18, 18', 18" was removed by heating the assembly represented by FIG. 7 to sufficiently high temperature (>630° C. for antimony) to melt strips 18, 18', 18". The melt was then removed by vacuum through a channel 21 and vacuum line 26 connected to a manifold communicating with the melt material of strips 18, 18', 18" which is in turn connected to the inlet and outlet ports of the mirror. The voids remaining after vacuum removal of the material of strips 18, 18', 18" comprise the passageways 22 through which coolant may flow in operation of the heat exchanger represented by the stacked configuration of tungsten or tungsten carbide layers 19, 19', 19" illustrated in FIG. 8. Residual antimony in the passageway 22 voids may be conveniently dissolved and removed chemically, if necessary.

Surface 23 of the last deposited layer of tungsten/tungsten carbide may be polished conventionally to the desired finish to comprise a mirrored surface or may be prepared for application of a mirror reflectivity enhancement layer by methods outside the scope of the invention.

There is, therefore, described herein a novel high energy laser heat exchanger and laser mirror and a method for fabricating same that represents a substantial improvement over the prior art. It is understood that certain modifications to the invention as hereinabove described may be made, as might occur to one with skill in the field of this invention, within the scope of the appended claims. Therefore, all embodiments contemplated hereunder have not been shown in complete detail. Other embodiments may be developed without departing from the spirit of this invention or from the scope of the appended claims.

We claim:

1. A method for fabricating a fluid cooled laser mirror, including a heat exchanger defining a plurality of fluid conducting passageways therethrough, which comprises the steps of:

a. providing a substrate comprising a carbon member;
b. depositing onto said substrate a transitional layer comprising carbon and tungsten carbide, said transitional layer varying in composition from substantially totally carbon in contact with said substrate to substantially totally tungsten carbide remote from said substrate, said substrate and transitional layer defining a substructure;
c. depositing onto said substructure a first layer of low melting point metal;
d. applying to said first layer a coating of photoresist material;
e. overlaying onto said coating a photographic mask having a predetermined pattern cut therein to define selected masked and unmasked portions of said coating;
f. exposing said unmasked portions of said coating to light to harden said unmasked portions of said coating;
g. chemically removing said unmasked portions of said coating and that portion of said first layer underlying said unmasked portion of said coating;
h. chemically removing said masked portion of said coating to provide a first intermediate structure comprising said substructure having thereon distinct areas of said low melting point metal configured in said predetermined pattern;
i. vapor depositing on said first intermediate structure a tungsten-containing second layer covering said low melting point metal pattern to a predetermined thickness;
j. removing said low melting point metal to provide a second intermediate structure comprising said first intermediate structure with said second layer applied and defining a plurality of passageways therethrough in said predetermined pattern; and
k. applying a mirrored surface to said second layer.

2. The method of claim 1 wherein following step i thereof, steps c through i are repeated using as said substructure said first intermediate structure with said second layer applied, and wherein said mirrored surface of step k is applied to the last deposited tungsten-containing layer.

3. The method of claim 1 wherein step i is characterized by depositing a tungsten-containing layer comprising a material selected from a group consisting of metallic tungsten and tungsten carbide.

4. The method of claim 1 wherein step c thereof is characterized by applying a first layer comprising antimony.

* * * * *